United States Patent
Noort et al.

(10) Patent No.: US 8,377,788 B2
(45) Date of Patent: Feb. 19, 2013

(54) SIGE HETEROJUNCTION BIPOLAR TRANSISTOR AND METHOD OF FORMING A SIGE HETEROJUNCTION BIPOLAR TRANSISTOR

(75) Inventors: Wibo Van Noort, Westbrook, ME (US); Jamal Ramdani, Scarborough, ME (US); Andre Labonte, Scarborough, ME (US); Donald Robertson Getchell, York, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 239 days.

(21) Appl. No.: 12/946,305

(22) Filed: Nov. 15, 2010

(65) Prior Publication Data
US 2012/0119262 A1    May 17, 2012

(51) Int. Cl.
*H01L 21/331* (2006.01)

(52) U.S. Cl. ........ 438/315; 438/235; 438/368; 438/312; 438/335; 438/336; 257/191; 257/197; 257/198; 257/E21.387

(58) Field of Classification Search ................. None
See application file for complete search history.

(56) References Cited

U.S. PATENT DOCUMENTS
5,702,958 A * 12/1997 Liu et al. ................. 438/309
2009/0302375 A1   12/2009 Sonsky et al.

OTHER PUBLICATIONS

Donkers, J.J.T.M. et al., "A Novel Fully Self-Aligned SiGe:C HBT Architecture Featuring a Single-Step Epitaxial Collector-Base Process", IEEE International Electron Devices Meeting IEDM, 2007, pp. 655-658.
Huylenbroeck et al., "A 400GHz fmax Fully Self-Aligned SiGe:C HBT Architecture", Bipolar/BiCMOS Circuits and Technology Meeting, 2009. BCTM 2009. IEEE, pp. 5-8.
Jurczak et al., "Silicon-on-Nothing (SON)—an Innovative Process for Advanced CMOS", IEEE Transactions on Electron Devices, vol. 47, No. 11, Nov. 2000, pp. 2179-2187.

* cited by examiner

*Primary Examiner* — Kyoung Lee
(74) *Attorney, Agent, or Firm* — Eugene C. Conser; Wade J. Brady, III; Frederick J. Telecky, Jr.

(57) ABSTRACT

A SiGe heterojunction bipolar transistor is fabricated by etching an epitaxially-formed structure to form a mesa that has a collector region, a cap region, and a notched SiGe base region that lies in between. A protective plug is formed in the notch of the SiGe base region so that thick non-conductive regions can be formed on the sides of the collector region and the cap region. Once the non-conductive regions have been formed, the protective plug is removed. An extrinsic base is then formed to lie in the notch and touch the base region, followed by the formation of isolation regions and an emitter region.

14 Claims, 7 Drawing Sheets

SIGE HETEROJUNCTION BIPOLAR TRANSISTOR AND METHOD OF FORMING A SIGE HETEROJUNCTION BIPOLAR TRANSISTOR

BACKGROUND OF THE INVENTION

1. Field of the Invention

The present invention relates to bipolar transistors and, more particularly, to a SiGe heterojunction bipolar transistor and a method of forming a SiGe heterojunction bipolar transistor.

2. Description of the Related Art

The performance of silicon germanium (SiGe) heterojunction bipolar transistors has increased dramatically in the past decade. For example, the cutoff frequency (fT) of these transistors has increased from approximately 60 GHz to approximately 400 GHz, while the frequency of maximum oscillation (fmax) of these transistors has increased from approximately 100 GHz to approximately 450 GHz.

This dramatic improvement in performance has allowed silicon-based solutions to be used in a number of high-speed applications. Silicon-based solutions are typically preferred over other solutions because silicon-based solutions have a significantly lower cost of raw materials (compared to III-V materials such as GaAs and InP). In addition, silicon-based solutions also bring a substantial reduction in system cost compared to other solutions due to superior levels of integration, versatility, and manufacturability.

Although silicon-based solutions that utilize current-generation SiGe heterojunction bipolar transistors provide substantially better performance than previous generations of devices and are less expensive to manufacture than other solutions, these current-generation transistors typically suffer from limited scalability and process complexity.

Thus, there is a need for a method of forming high-performance SiGe heterojunction bipolar transistors that is more scalable and less complex.

DETAILED DESCRIPTION OF THE INVENTION

Figure 1A:
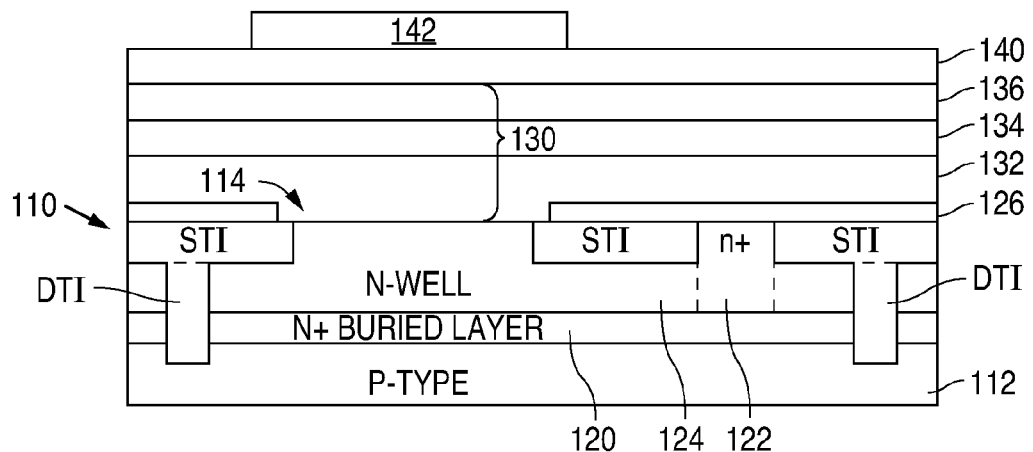
FIGS. 1A-1M are a series of cross-sectional views illustrating an example of a method of forming a SiGe heterojunction bipolar transistor 100 in accordance with the present invention.

FIGS. 1A-1M show a series of cross-sectional views that illustrate an example of a method of forming a SiGe heterojunction bipolar transistor 100 in accordance with the present invention. As shown in FIG. 1A, the method utilizes a semiconductor wafer 110 that has been conventionally formed to include a p-type region 112, a deep trench isolation structure DTI, a shallow trench isolation structure STI, and a collector structure 114.

As further shown in FIG. 1A, collector structure 114 includes an n+ buried layer 120 that lies above and touches p-type region 112, an n+ sinker region 122 that extends down and touches n+ buried layer 120, and an n-well 124 that extends down and touches n+ buried layer 120 and n+ sinker region 122.

Collector structure 114 is not limited to the above example, but can be implemented in any of a number of conventional manners. For example, an isolated back side metal structure can extend through p-type region 112 to make an electrical connection with n+ buried layer 120 in lieu of using n+ sinker region 122.

Transistor 100 can be formed in a bipolar only process, or as part of a BiCMOS process. When transistor 100 is formed as part of a BiCMOS process, the CMOS transistors are typically partially formed before the bipolar transistors are formed with the exception of the buried layer and the sinker region. Once the CMOS transistors have been formed, the CMOS transistor are covered with a CMOS protect layer, which is typically formed from oxide, nitride, or a combination of oxide and nitride. (The heavily-doped source and drain regions are formed before the bipolar transistors in some BiCMOS processes, and after the bipolar transistors have been formed in other BiCMOS processes.)

In the present example, as additionally shown in FIG. 1A, semiconductor wafer 110 is illustrated as part of a BiCMOS process, and also conventionally processed to include a CMOS protect layer 126 that has been selectively removed in a conventional manner to expose the top surface of n-well 124. In a bipolar only process, CMOS protect layer 126 is not present.

The method of the present invention begins by growing an epitaxial stack 130 on n-well 124 and, in the present example, CMOS protect layer 126. Epitaxial stack 130 includes an n-type drift collector layer 132 that touches n-well 124 and CMOS protect layer 126, a p-type silicon germanium (SiGe) base layer 134 that touches drift collector layer 132, and an n-type cap layer 136 that touches SiGe base layer 134. Epitaxial stack 130 can be formed in a conventional manner using differential epitaxy, selective epitaxy, or a combination of the two.

In the present example, epitaxial stack 130 is first formed with a selective epitaxy, and then followed with a differential expitaxy. In this process, the regions of epitaxial stack 130 that lie directly vertically above n-well 124 are formed as single-crystal silicon, while the regions lying directly above CMOS protect layer 126 are formed as polycrystalline silicon.

In addition, n-type drift collector layer 132 is formed to have a low doping level, p-type SiGe base layer 134 is formed to have an intermediate doping level, and n-type cap layer 136 is formed undoped or to have a low to intermediate doping level. Further, cap layer 136 is formed to be thin, e.g., 200-300 angstroms.

Following the formation of epitaxial stack 130, a hard mask layer 140 is formed on the top surface of epitaxial stack 130. Hard mask layer 140 can be formed by, for example, a layer of nitride, a layer of oxide, or a combination of nitride and oxide layers. Once hard mask layer 140 has been formed, a patterned photoresist layer 142 is formed on the top surface of hard mask layer 140.

Patterned photoresist layer 142 is formed in a conventional manner, which includes depositing a layer of photoresist, projecting a light through a patterned black/clear glass plate known as a mask. Exposure to light causes "positive" resist to dissolve during a subsequent development step. Less commonly used resist of the "negative" type exhibits an opposite response, i.e., the unexposed areas dissolve during a subsequent development step.

Patterned photoresist layer 142 is a brightfield mask, which means that the device is formed where resist remains. With a positive photoresist this leads to a predominantly transparent (brightfield) mask. Patterning of a small structure of remaining resist is generally easier than patterning of a small omission of resist (a hole), thus leading to improved scalability.

Figure 1B:
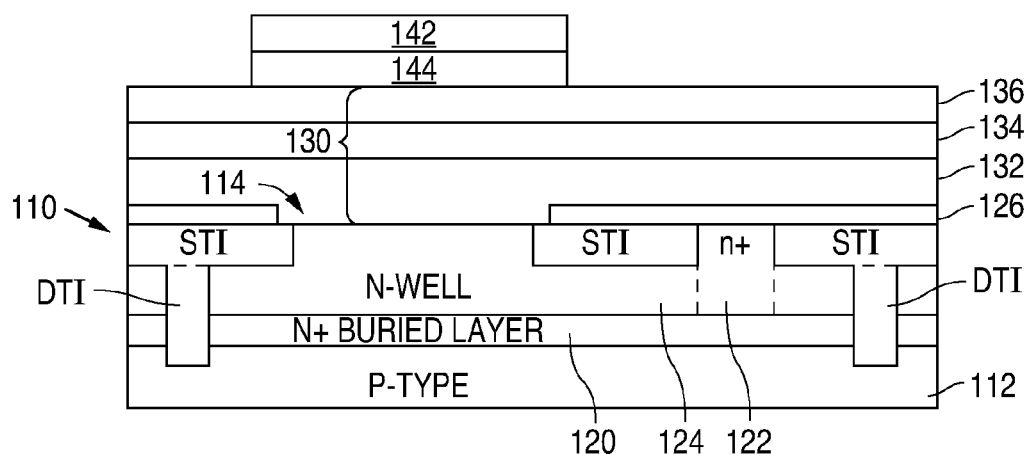
Figure 1C:
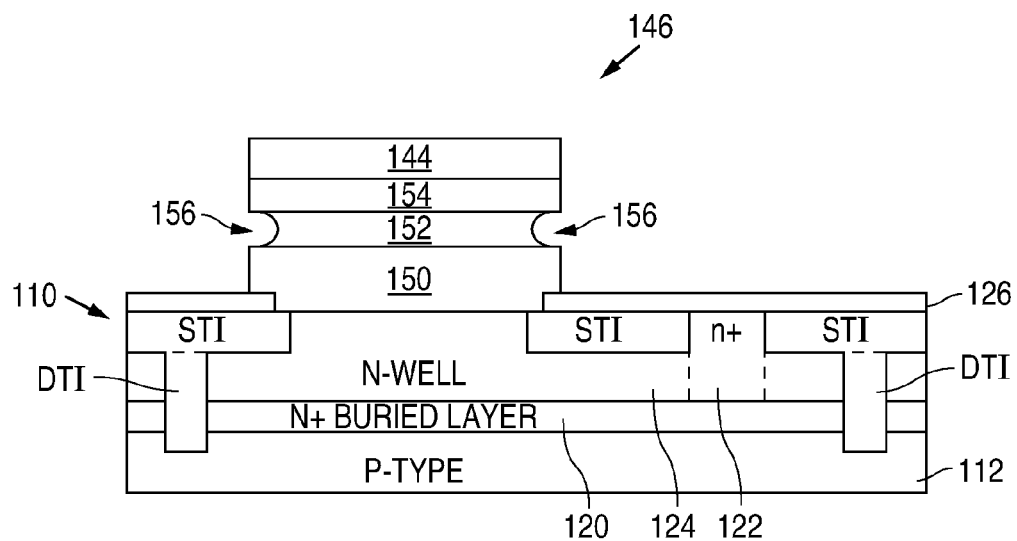

As shown in FIG. 1B, after patterned photoresist layer 142 has been formed, the exposed regions of hard mask layer 140 are etched to form a hard mask 144 on the top surface of epitaxial stack 130. As shown in FIG. 1C, following the formation of hard mask 144, a mesa 146 is formed. Mesa 146, in turn, has a drift collector region 150, a SiGe base region 152, and a cap region 154.

Mesa 146 can be formed with a first etch that etches the exposed regions of epitaxial stack 130. The first etch removes patterned photoresist layer 142 from the top surface of hard mask 144, and also removes the exposed portion of cap layer 136 to form cap region 154 and expose a portion of SiGe base layer 134.

In addition, the first etch completely removes the exposed portion of SiGe base layer 134 to form an SiGe region and expose a portion of drift collector layer 132. Further, the first etch can remove all or a part of the exposed portion of drift collector layer 132. In the FIG. 1C example, all of the exposed portion of drift layer 132 is removed to form drift collector region 150 and expose CMOS protect layer 126. (If epitaxial stack 130 is formed using only selective epitaxy, the etchant used in the first etch must be selective to CMOS protect layer 126 to prevent this layer from being removed.)

Following the first etch, a second etch is used to selectively and isotropically etch a notch 156 into the exposed side wall of the SiGe region to form SiGe base region 152. In the second etch, the SiGe region is etched with an etchant that is highly selective to hard mask 144 and the materials exposed by the first etch, e.g., CMOS protect layer 126 and the silicon in drift collector region 150 and cap region 154.

There are various well-known techniques for selectively etching SiGe with respect to these other materials. For example, SiGe can be selectively and isotropically etched using either a wet chemical etch or dry etch (i.e., a plasma etcher or remote plasma). The most common method of selectively etching SiGe is known as "silicon-on-nothing," which is based on a plasma etch that is rich in fluorine radicals as described in Jurczak et al., "Silicon-on-Nothing (SON)—an Innovative Process for Advanced CMOS", IEEE Transactions on Electron Devices, Vol. 47, No. 11, November 2000, which is hereby incorporated by reference.

In the preferred embodiment, mesa 146 is formed in a dry plasma process that includes the "silicon-on-nothing" plasma etch. Thus, the first and second etches are integrated into a single etch process. For example, fluorine radicals can be added to the plasma to form notch 156 after SiGe base layer 134 has been etched to expose drift collector layer 132. By integrating the first and second etches into a single etch process, the formation of native oxide can be prevented.

Figure 1D:
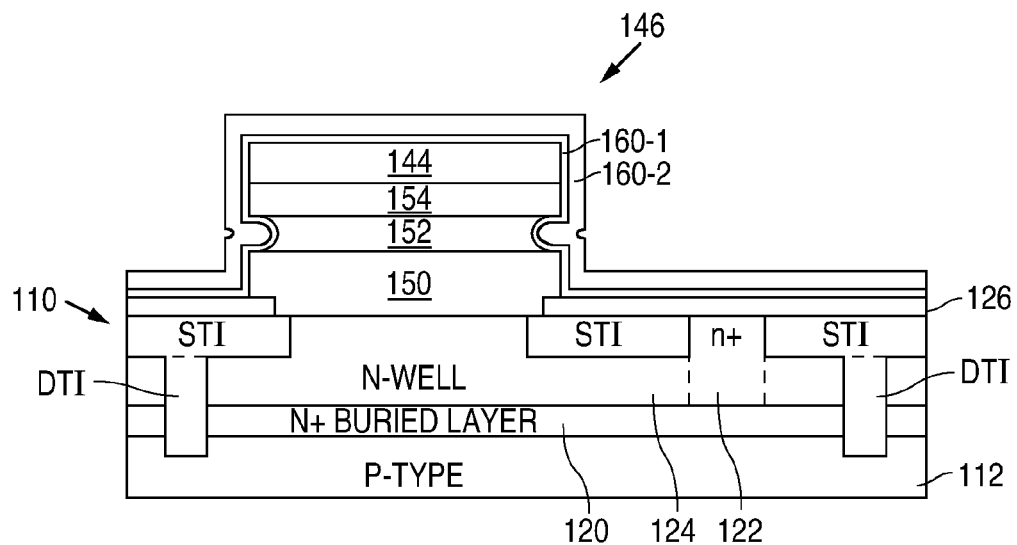

As shown in FIG. 1D, following the formation of mesa 146, a first protective layer 160-1 is conformally deposited on mesa 146, followed by the conformal formation of a second protective layer 160-2 on protective layer 160-1. As illustrated in FIG. 1D, the conformal deposition of protective layer 160-2 plugs notch 156.

Protective layer 160-2 is implemented with a material which can be selectively removed from protective layer 160-1, and which is resistant to oxidization and wet chemical oxide removal, such as with hydrofluoric acid. For example, protective layer 160-1 can be implemented with an oxide layer, while protective layer 160-2 can be implemented with a nitride layer. The oxide layer can be formed with a chemical vapor deposition oxide, such as TEOS, as illustrated in FIG. 1D, or an in-situ-steam-generated (ISSG) oxide. In addition, the nitride layer can be formed with a chemical vapor deposition nitride.

Figure 1E:
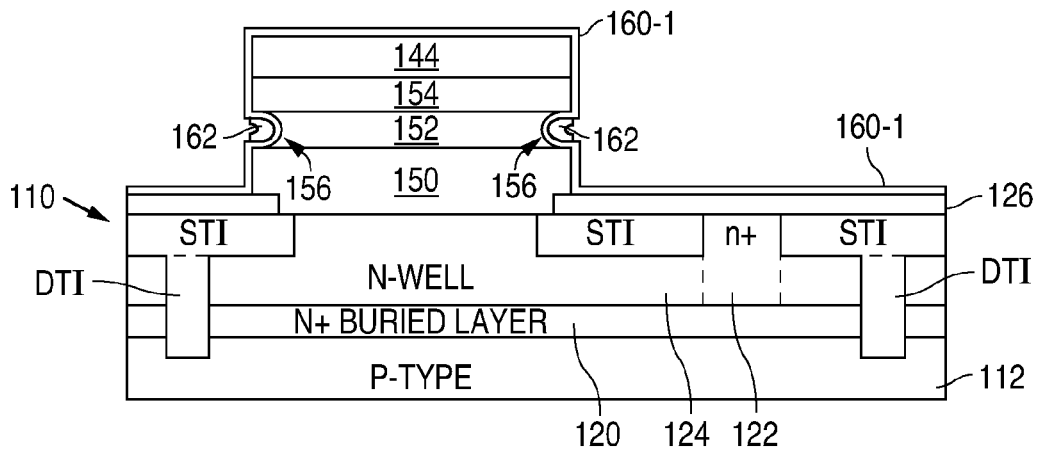

Next, as shown in FIG. 1E, a protective plug 162 is formed by isotropically etching protective layer 160-2 so that protective layer 160-2 is only left in notch 156. Thus, protective plug 162 is a nitride plug when protective layer 160-2 is implemented from nitride. Protective layer 160-2 can be etched with a timed wet etch or a dry etch using endpoint detection. The wet etch can be implemented with, for example, an etchant such as phosphoric acid. Phosphoric acid, which is highly selective to oxide, leaves substantially all of protective layer 160-1 intact.

Figure 1F:
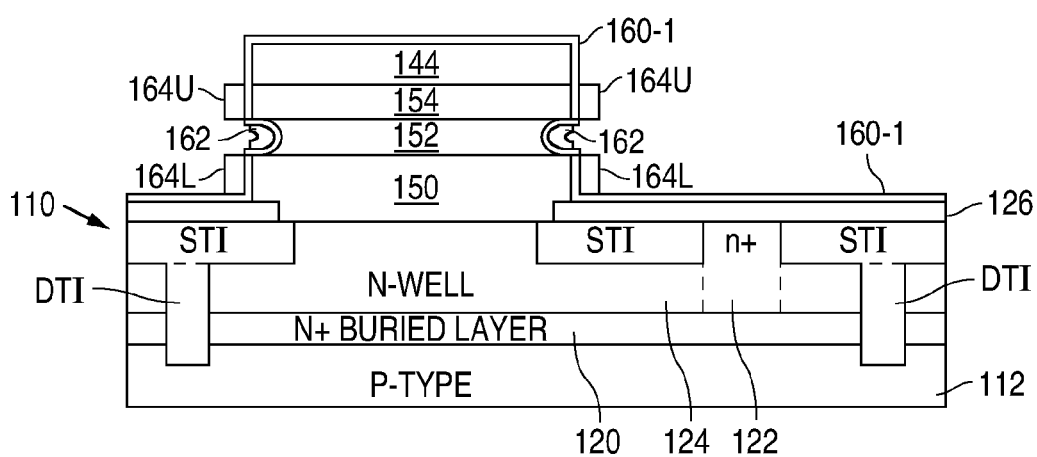

After the formation of protective plug 162, as shown in FIG. 1F, a non-conductive region 164L is formed on the portion of protective layer 160-1 that touches drift collector region 150, while a non-conductive region 164U is formed on the portion of protective layer 160-1 that touches cap region 154. The non-conductive regions 164L and 164U, which are completely spaced apart from each other by protective plug 162, can be implemented with, for example, ISSG oxide. ISSG oxide ensures that the high stress areas close to protective plug 162 are evenly oxidized.

Figure 1G:
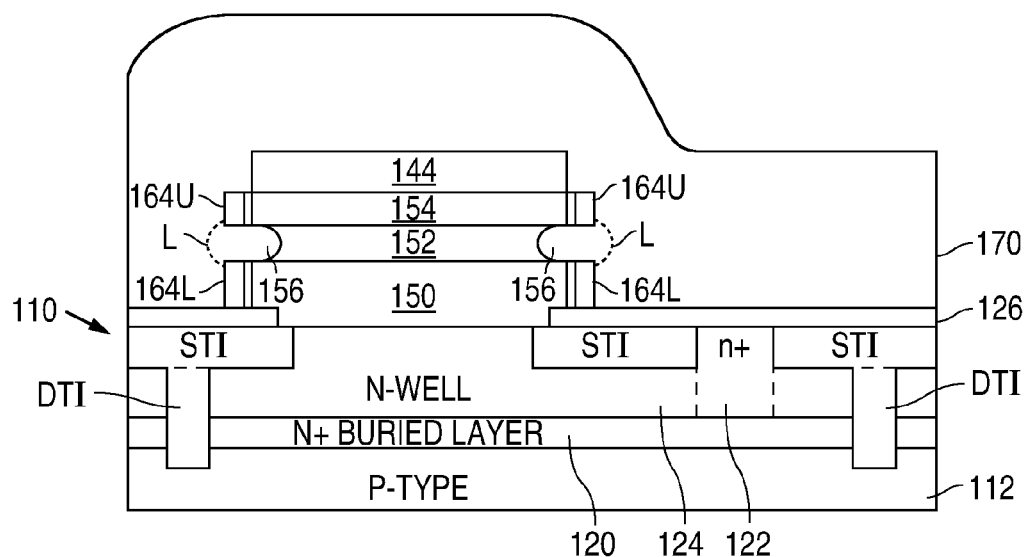

As shown in FIG. 1G, once the non-conductive regions 164L and 164U have been formed, protective plug 162 is removed. When protective layer 160-1 is formed from oxide and protective layer 160-2 is formed from nitride, protective plug 162 is removed with an etchant that is highly selective to oxide, such as phosphoric acid.

The exposed regions of protective layer 160-1 are then removed with, for example, a timed etch using hydrofluoric acid to expose SiGe base region 152. The etch also removes the portions of protective layer 160-1 that touch CMOS protect layer 126 and hard mask 144. In addition, portions of the non-conductive regions 164L and 164U are also removed, but since the non-conductive regions 164L and 164U are thicker, the non-conductive regions 164L and 164U remain adjacent to drift collector region 150 and cap region 154 after SiGe base region 152 has been exposed.

Following the exposure of SiGe base region 152, a heavily-doped p-type base layer 170 is formed to touch hard mask 144, SiGe base region 152, and the non-conductive regions 164L and 164U. (If collector drift layer 132 was completely removed during the etch illustrated in FIG. 1C, then base layer 170 also touches CMOS protect layer 126 as illustrated in FIG. 1G. If collector drift layer 132 was only partially removed, then base layer 170 touches the remaining portion of collector drift layer 132.)

Base layer 170 can be grown with selective epitaxy, differential epitaxy, or a combination of the two. For example, a selective epitaxy can be used to grow single-crystal silicon in notch 156 and then, when the single-crystal silicon has grown sideways outward as indicated by the dashed lines L in FIG. 1G, a differential epitaxy can be used to grow the remainder of base layer 170. Alternately, deposited polysilicon can be used to form base layer 170. Base layer 170 is conventionally doped, such as with in-situ doping.

Figure 1H:
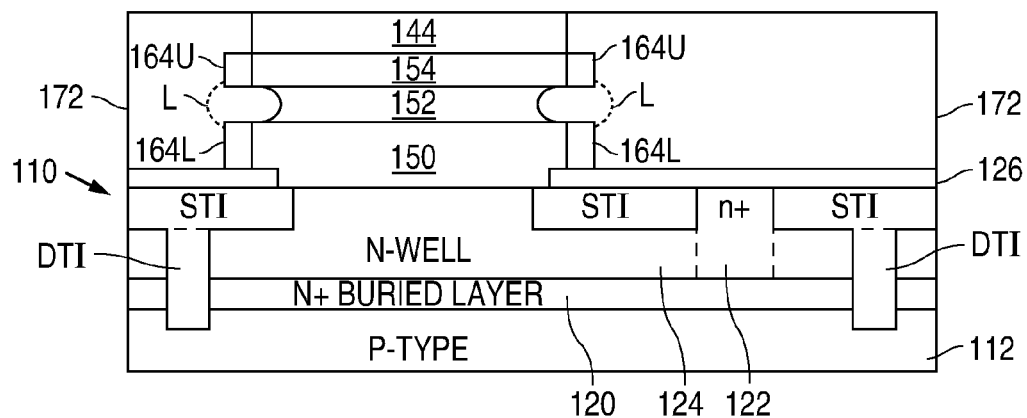

As shown in FIG. 1H, once base layer 170 has been formed, base layer 170 is planarized to remove base layer 170 from the top surface of hard mask 144 to form a planarized base 172. Base layer 170 can be planarized using conventional methods, such as chemical-mechanical polishing or an etch back. (Etch back requires that a planarizing material, such as photoresist, which has an etch rate similar to base layer 170 be deposited before the etch back begins.)

Figure 1I:
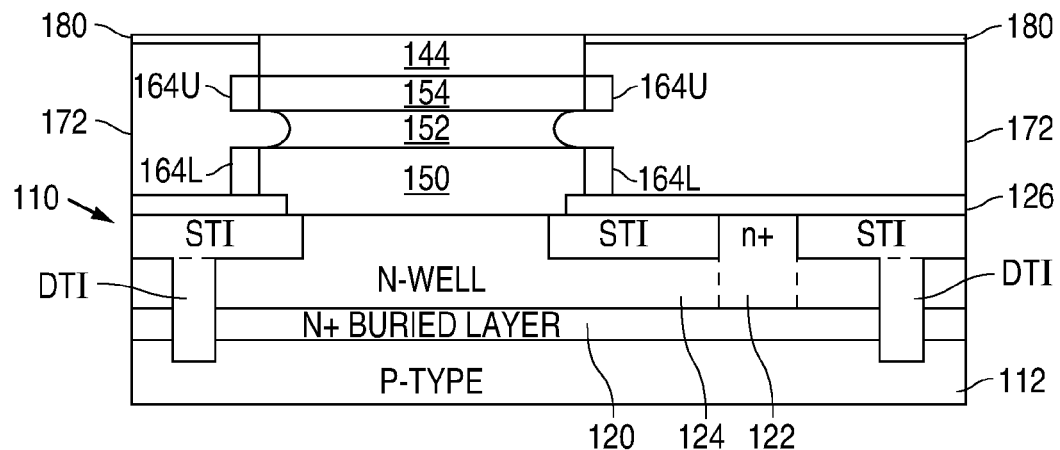
Figure 1J:
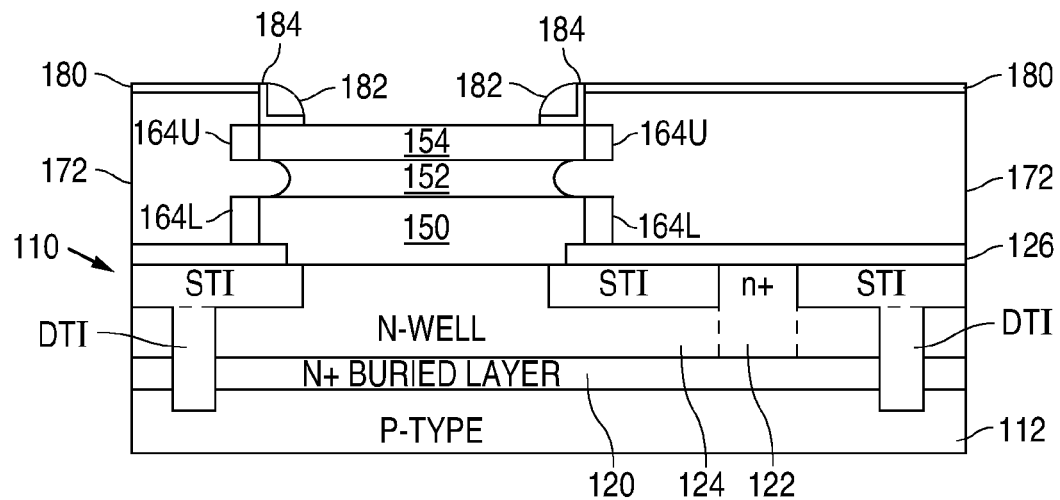

After planarized base 172 has been formed, as shown in FIG. 1I, an isolation layer 180 is formed on planarized base 172. Isolation layer 180 can be implemented with, for example, ISSG oxide. As shown in FIG. 1J, following the formation of isolation layer 180, hard mask 144 is removed using conventional etchants and steps to expose the top surface of cap region 154.

For example, when isolation layer 180 is implemented with oxide and hard mask 144 is implemented with oxide and an overlying layer of nitride, the hard mask nitride is first removed with an etchant that is highly selective to the isolation layer oxide, such as phosphoric acid, followed by the removal of the hard mask oxide with, for example, a timed etch using hydrofluoric acid. The isolation layer oxide 180 is thicker than the oxide of hard mask 144 so that the isolation layer oxide 180 remains on planarized base 172 after hard mask 144 has been removed.

After hard mask 144 has been removed, a side wall spacer is formed. A side wall spacer can be formed in a number of different ways. For example, a spacer material including layers of oxide, nitride, and oxide can be deposited on cap region 154 and isolation layer 180. Following this, the spacer material is anisotropically etched back to expose the central region of the top surface of cap region 154, and form a D-shaped side wall spacer 182 of oxide and an L-shaped side wall spacer 184 of oxide and overlying nitride that touches planarized base 172 and the top surface of cap region 154. After this, the D-shaped side wall spacer 182 is removed to leave the L-shaped side wall spacer 184.

Alternately, a spacer material including layers of oxide, nitride, and polysilicon can be deposited on cap region 154 and isolation layer 180. Following this, the polysilicon is anisotropically etched back to expose the nitride over the central region of the top surface of cap region 154 and form a D-shaped side wall spacer 182 of polysilicon. After this, the nitride layer is etched back (isotropically or anisotropically) to expose the central region of the top surface of cap region 154, and form an L-shaped side wall spacer 184 of oxide and overlying nitride that touches planarized base 172 and the top surface of cap region 154. After this, the D-shaped side wall spacer 182 of polysilicon is removed in-situ to leave the L-shaped side wall spacer 184. In a further alternate approach, only oxide can be used as the spacer material. In this case, the resulting oxide spacer looks like D-shaped spacer 182 without the L-shaped section.

Figure 1K:
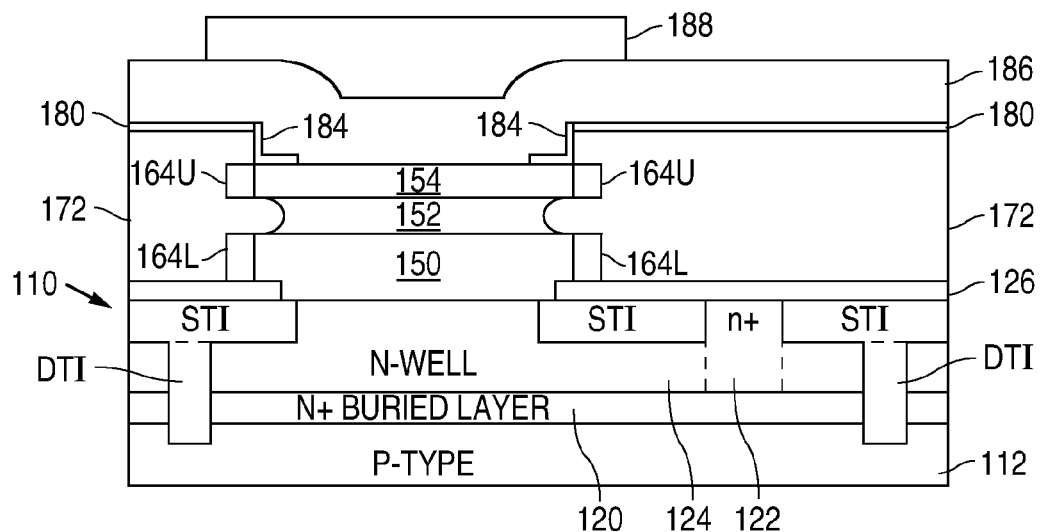

As shown in FIG. 1K, once side wall spacer 184 has been formed, a heavily-doped n-type emitter layer 186 is formed to touch the top surface of cap region 154, isolation layer 180, and side wall spacer 184. (Cap region 154 is cleaned before emitter layer 186 is formed with an etchant that removes oxide at a substantially greater rate than nitride.)

Emitter layer 186 can be grown with selective epitaxy, differential epitaxy, or a combination of the two. Alternately, deposited polysilicon can be used to form emitter layer 186. Emitter layer 186 can be doped with conventional methods (e.g., in-situ, ion implantation, diffusion). The preferred method is in-situ doping. After emitter layer 186 has been formed, a patterned photoresist layer 188 is formed on the top surface of emitter layer 186 in a conventional manner.

After patterned photoresist layer 186 has been formed, as shown in

Figure 1L:
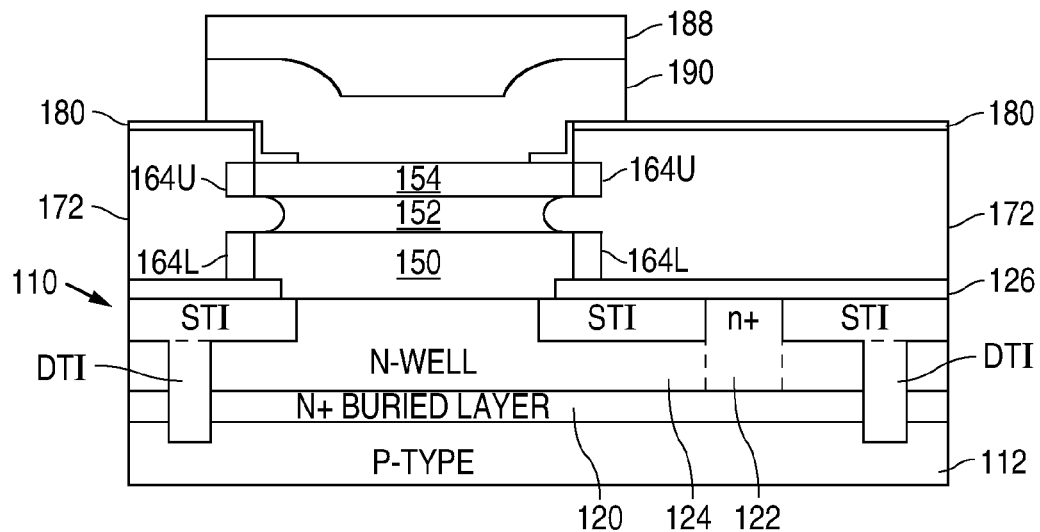

FIG. 1L, the exposed regions of emitter layer 186 are etched to form an emitter 190. Following this, as shown in FIG. 1M, patterned photoresist layer 186 is removed, and SiGe heterojunction bipolar transistor 100 is completed by etching planarized base 172 (and any remaining portion of drift collector layer 132) in a conventional manner to form an extrinsic base 192 that is laterally spaced apart from adjacent extrinsic bases and which no longer lies over sinker region 122.

The method then continues with conventional steps to complete the formation of the CMOS transistors as needed, form an overlying isolation layer, and form metallic contacts that extend through the isolation layer to make electrical connections with sinker region 122, emitter 190, and extrinsic base 192. In addition, a rapid thermal process is used to activate the source and drain regions within the CMOS devices, and to activate and diffuse dopants from emitter 190 into cap region 154.

Figure 1M:
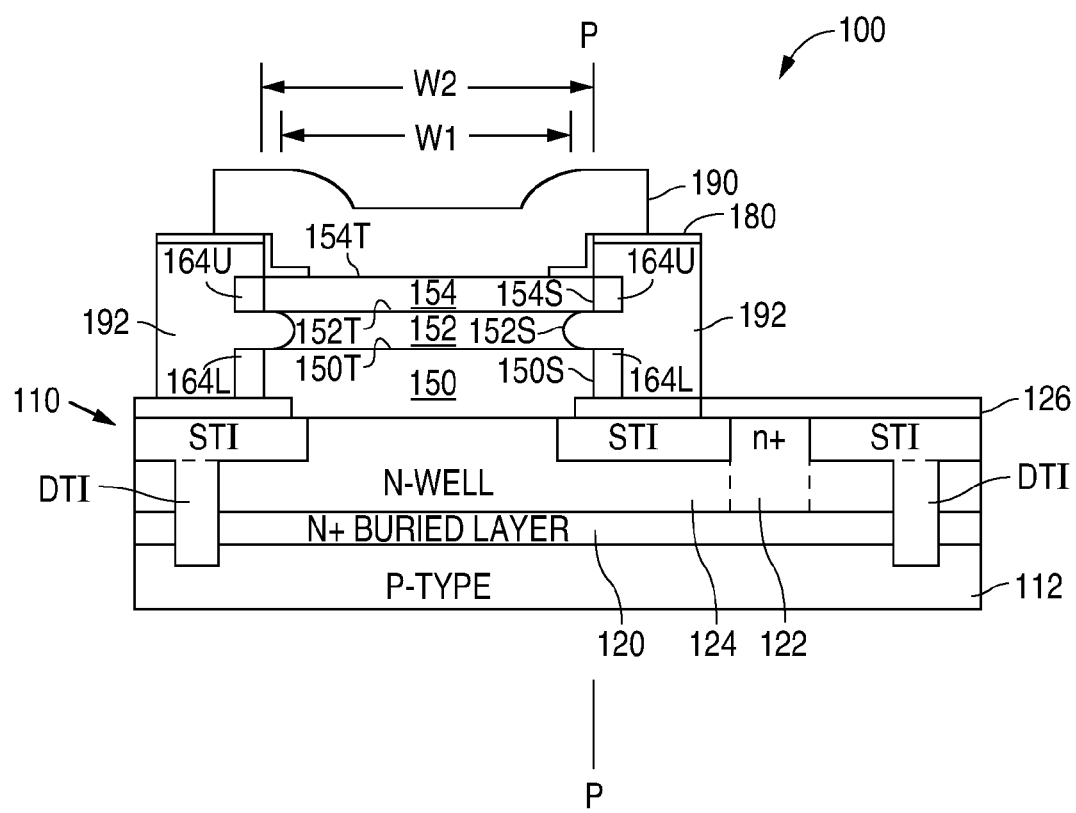

Thus, as shown in FIG. 1M, the method of the present invention forms SiGe heterojunction bipolar transistor 100 to have a lower single-crystal silicon region 150 of a first conductivity type, a single-crystal silicon germanium (SiGe) region 152 of a second conductivity type, and an upper single-crystal silicon region 154 of the first conductivity type.

Lower single-crystal silicon region 150 has a top surface 150T, and a substantially vertical side wall surface 150S, while upper single-crystal silicon region has a top surface 154T and a substantially vertical side wall surface 154S that lies substantially in the same vertical plane P as the substantially vertical side wall surface 150S of lower single-crystal silicon region 150. In addition, single-crystal SiGe region 152 has a top surface 152T and a side wall surface 152S. However, no portion of side wall surface 152S lies within the vertical plane P.

Further, single-crystal SiGe region 152 has a maximum width W1 measured in a direction, while upper single-crystal silicon region 154 has a maximum width W2 measured in the same direction. As shown in FIG. 1M, the maximum width W1 of single-crystal SiGe region 154 is less than the maximum width W2 of upper single-crystal silicon region 154.

The method of the present invention also forms SiGe heterojunction bipolar transistor 100 to have a first isolation region 160-1/164L that touches the side wall 150S of lower single-crystal silicon region 150, and a second isolation region 160-1/164U that touches the side wall 154S of upper single-crystal silicon region 154. Second isolation region 160-1/164U is completely spaced apart from first isolation region 160-1/164L.

Further, the method of the present invention also forms SiGe heterojunction bipolar transistor 100 to have an extrinsic base 192 that touches first isolation region 160-1/164L, second isolation region 160-1/164U, and single-crystal SiGe region 152. As shown in FIG. 1M, extrinsic base 192 lies horizontally adjacent to first isolation region 160-1/164L and horizontally adjacent to second isolation region 160-1/164U.

The present invention provides several advantages. When a selective/differential epitaxy combination or a differential epitaxy is used to form epitaxial stack 130, the etch of epitaxial stack 130 to form mesa 146 removes the mono SiGe-to-poly SiGe boundary, thereby removing the resistance associated with this boundary.

Further, when extrinsic base layer 170 is formed by selective epitaxy such that single-crystal silicon grows sideways outward as indicated by the dashed lines L in FIG. 1G, and then followed by differential epitaxy, the surface area of the mono-to-poly boundary is substantially increased. Substantially increasing the surface area of the mono-to-poly boundary, particularly inside highly-doped extrinsic base layer 170, substantially reduces the resistance associated with the boundary.

In addition, by forming extrinsic base layer 170 separately from the formation of SiGe base layer 134, the thickness and dopant concentration of extrinsic base layer 170 can be substantially greater. A thick heavily-doped (e.g., p++) extrinsic base layer 170 substantially reduces the resistance of extrinsic base 192. Also, since silicon has a larger bandgap than silicon germanium, the formation extrinsic base layer 170 as a silicon layer prevents the lateral diffusion of minority carriers into extrinsic base 192, which would cause additional stored charge that does not contribute to the transistor action.

Another advantage is that extrinsic base 192 is vertically self aligned to SiGe base region 152. The formation of notch 156, the formation of protective plug 162, the formation of the non-conductive regions 164L and 164U, and the removal of protective plug 162 self aligns SiGe base region 152 to the to-be-formed extrinsic base layer. In other words, regardless of whether process variations cause SiGe base region 152 to be vertically higher or lower, extrinsic base layer 170 can be formed without any critical control of the layer thicknesses.

It should be understood that the above descriptions are examples of the present invention, and that various alternatives of the invention described herein may be employed in practicing the invention. For example, although the present invention has been described in terms of an npn transistor, the present invention applies equally to a pnp transistor. Thus, it is intended that the following claims define the scope of the invention and that structures and methods within the scope of these claims and their equivalents be covered thereby.

What is claimed is:

1. A method of forming a bipolar transistor comprising:
   forming a mesa that has a collector region, a base region that lies above and touches the collector region, a cap region that lies above and touches the base region, and a hard mask that lies above and touches the cap region, the collector region having a first conductivity type, the base region having a second conductivity type and a notch, the cap region having a first conductivity type and a top surface;
   forming a first protective layer that touches the collector region, the base region, and the cap region;
   forming a second protective layer that touches the first protective layer; and
   removing the second protective layer so that the second protective layer is only left in the notch to form a protective plug that lies within the notch.

2. The method of claim 1 and further comprising forming a first non-conductive region and a second non-conductive region that touch the first protective layer, the first and second non-conductive regions being completely spaced apart by the protective plug.

3. The method of claim 2 and further comprising:
   removing the protective plug and a portion of the first protective layer to expose the base region; and
   forming an extrinsic base that lies in the notch to touch the base region and touches the first and second non-conductive regions, the first non-conductive region lying between the extrinsic base and the collector region, the second non-conductive region lying between the extrinsic base and the cap region.

4. The method of claim 3 and further comprising forming an isolation layer that touches the extrinsic base, the isolation layer being spaced apart from the collector region, the base region, and the cap region.

5. The method of claim 4 and further comprising removing the hard mask after the isolation layer has been formed to expose a top surface of the cap region.

6. The method of claim 5 and further comprising forming a side wall spacer that touches the top surface of the cap region and the extrinsic base after the hard mask has been removed.

7. The method of claim 6 and further comprising forming an emitter to touch the cap region and the side wall spacer.

8. The method of claim 7 wherein forming the emitter includes:
   forming an epitaxial structure that touches the cap region; and
   etching the epitaxial structure to remove a portion of the epitaxial structure.

9. The method of claim 3 wherein forming the extrinsic base includes:
   forming an epitaxial structure to touch the base region; and
   planarizing the epitaxial structure to remove the epitaxial structure from a top surface of the hard mask and form a planarized epitaxial structure.

10. The method of claim 9 wherein forming the extrinsic base further includes etching the planarized epitaxial structure to remove a portion of the planarized epitaxial structure.

11. The method of claim 1 wherein forming the mesa includes:
    forming an epitaxial structure that has a first silicon layer, a silicon germanium layer that touches and lies above the first silicon layer, and a second silicon layer that touches and lies above the silicon germanium layer;
    forming the hard mask on a top surface of the epitaxial structure, the hard mask exposing a portion of the epitaxial structure; and
    etching the portion of the epitaxial structure exposed by the hard mask.

12. The method of claim 11 wherein etching the portion of the epitaxial structure includes an etch that removes silicon germanium at a substantially greater rate than silicon to form the notch.

13. The method of claim 11 wherein the collector region includes single-crystal silicon and has a first conductivity type, the base region includes single-crystal silicon germanium and has a second conductivity type, and the cap region includes single-crystal silicon and has a first conductivity type.

14. The method of claim 13 wherein a maximum width of the base region measured in a direction is less than a maximum width of the cap region measured in the direction.

* * * * *